(12) United States Patent
Werner, Jr.

(10) Patent No.: US 6,489,777 B2
(45) Date of Patent: Dec. 3, 2002

(54) SYSTEM FOR PURGING ELECTROSTATIC VOLTMETER MODULATOR ASSEMBLY

(75) Inventor: Alan J. Werner, Jr., Rochester, NY (US)

(73) Assignee: Xerox Corporation, Stamford, CT (US)

( * ) Notice: Subject to any disclaimer, the term of this patent is extended or adjusted under 35 U.S.C. 154(b) by 105 days.

(21) Appl. No.: 09/770,243

(22) Filed: Jan. 29, 2001

(65) Prior Publication Data

US 2002/0101246 A1 Aug. 1, 2002

(51) Int. Cl.[7] .............................................. G01R 29/12
(52) U.S. Cl. ...................................... 324/458; 324/72.5
(58) Field of Search ........................ 324/72, 452, 457, 324/458, 72.5; 399/50

(56) References Cited

U.S. PATENT DOCUMENTS

| | | | | |
|---|---|---|---|---|
| 3,640,246 A | * | 2/1972 | Jeromin et al. | 118/629 |
| 4,697,920 A | * | 10/1987 | Palm et al. | 399/39 |
| 5,212,451 A | | 5/1993 | Werner | 324/458 |
| 5,311,266 A | * | 5/1994 | Madea | 346/123 |
| 5,404,210 A | * | 4/1995 | Day | 399/225 |
| 5,489,850 A | | 2/1996 | Werner | 324/458 |
| 6,327,447 B1 | * | 12/2001 | Nakano et al. | 399/92 |
| 6,381,438 B2 | * | 4/2002 | Kubo | 399/350 |
| 6,415,121 B1 | * | 7/2002 | Suzuki et al. | 399/111 |

* cited by examiner

Primary Examiner—Christine K. Oda
Assistant Examiner—Walter Benson
(74) Attorney, Agent, or Firm—Oliff & Berridge, PLC

(57) ABSTRACT

A system for enhancing air purging of a modulator assembly of an electrostatic voltmeter for an electrophotographic process. A vane connected to a chopper element is located at one end of a vibratory beam so as to move when the vibratory beam oscillates. Movement of the vane generates air turbulence and currents in the vicinity of the modulator and sensor electrode thereby improving purging of toner particles and other contaminants and preventing such contaminants, which tend to cause drift errors, from settling in the vicinity of the modulator and sensor electrode.

8 Claims, 5 Drawing Sheets

SYSTEM FOR PURGING ELECTROSTATIC VOLTMETER MODULATOR ASSEMBLY

BACKGROUND OF THE INVENTION

The present invention relates to system for purging a modulator assembly of electrostatic voltmeters. More particularly, the invention is directed to self-enhanced purging of a modulator and probe for electrostatic voltmeters for use in electrophotographic processes.

In an electrostatic imaging process, six stages are utilized to produce an archival quality image on a copy sheet, such as a page of plain paper. These steps are practiced upon and around a photoreceptor element (P/R), such as a photoreceptor belt or drum, hereinafter simply "photoreceptor." The imaging stages comprise: (1) photoreceptor charging, (2) image formation or exposure, (3) image development, (4) image transfer from the photoreceptor to a copy sheet, (5) fixing of the image on the copy sheet, and (6) restoring the photoreceptor. The process proceeds in a continuous loop and, if a color image is desired, steps (1), (2) and (3) are repeated in sequential stations around the photoreceptor for toner particles of black, magenta, yellow and cyan prior to completing steps (4) through (6) of image transfer, image fixing and restoring the photoreceptor surface to a clean and neutral state.

The second and third process steps of latent image formation on the photoreceptor and image development by applying a desired quantity of toner at a precise location on the photoreceptor latent image require accurate control of an electrostatic charge on the photoreceptor. This can be accomplished by electrostatic charge monitoring and a feedback loop. In particular, in a high speed image development process the toner particles are highly charged and coulomb forces are used to attach charged toner particles to a latent image on the photoreceptor. The magnitude and location of toner deposit is critical to a successful high speed electrophotographic process and thus accurate monitoring and modulation of an electrostatic field around the photoreceptor is essential. In this, electrostatic voltmeters, such as application specific integrated circuit electrostatic voltmeters, measure electrostatic fields or potential without current flow through the electrostatic voltmeter. A typical electrostatic voltmeter includes a modulator assembly having a sensor electrode or probe and a modulator for modulating the electrostatic field that is being measured in relation to the sensor. In this, the modulator assembly is the sensing element of the electrostatic voltmeter. Electrostatic voltmeters of this type are disclosed in U.S. Pat. No. 5,212,451 to Werner, issued May 18, 1993, and U.S. Pat. No. 5,489,850 to Werner et al., issued Feb. 6, 1996, both of which are assigned to the Xerox Corporation and of common assignment with the subject application. The disclosures of these prior art patents are hereby incorporated by reference as though set forth at length.

One problem with current electrostatic voltmeter modulator assemblies in electrophotographic systems is that charged toner particles, which are used for developing electrostatic latent images, tend to be attracted to the modulator and/or probe. Moreover, paper dust, photoreceptor drive surface fines, and other air borne debris within an electrophotographic cabinet tend to be attracted to the modulator and/or electrostatic probe. Air borne contaminants tend to cause errors in the measurement of an electrostatic field. Such errors are referred to as "drift errors". One solution to this problem is to provide an air purge in the electrophotographic systems to prevent charge toner particles from getting into the modulator assembly and proximate to the probe by creating a positive air pressure around the modulator and probe. Specifically, an air purge path is provided at the front of the modulator base so that a positive air pressure is created across a sensing aperture in a front plate attached to the modulator base to purge toner particles and other contaminants from the modulator and probe. Such an approach to purging contaminants from the modulator and probe is disclosed in co-pending application Ser. No. 09/770,242 of Werner, title "MODULATOR BASE FOR ELECTROSTATIC VOLTMETER MODULATOR ASSEMBLY", filed on the same date as the subject application, assigned to the Xerox Corporation and of common assignment with the subject application. The disclosure of the aforementioned co-pending application is hereby incorporated by reference as though set forth at length.

It has, however, been found that contaminants and charged toner particles tend to migrate into the modulator and probe even though an air purge is provided. Accordingly, it would be desirable to provide a system for enhancing the purging of toner and contaminants from the modulator assembly and the probe of electrostatic voltmeters.

The difficulties and limitations suggested in the preceding are not intended to be exhaustive, but rather are among many which demonstrate that prior art electrostatic voltmeter devices will admit to worthwhile improvement.

It is, therefore, a general object of the invention to provide an improved electrostatic voltmeter system, which will obviate or minimize difficulties of the type previously described.

It is another general object of the invention to provide an improved modulator assembly for an electrostatic voltmeter operable for providing a high level of photoreceptor voltage control for an electrophotographic process.

It is a specific object of the invention to provide an improved modulator assembly of an electrostatic voltmeter having a system for purging the modulator and probe to obtain improved operational reliability of the electrostatic voltmeter.

It is another specific object of the invention to provide an improved modulator assembly having a system for enhanced air purging of the modulator and probe.

It is another specific object of the invention to provide a system for purging a modulator and probe assembly of an electrostatic voltmeter which is easy to fabricate and exhibits enhanced operational efficiency.

It is yet another specific object of the invention to provide an improved system for self-enhanced purging of a modulator and probe of an electrostatic voltmeter, which minimizes the possibility of charged toner particles and other air borne contaminants from settling inside the sensor assembly.

SUMMARY OF THE INVENTION

To achieve at least some of the foregoing objects, the invention provides a modulator assembly of electrostatic voltmeters having a modulator base with a vibratory beam disposed inside the base for oscillating when a vibratory magnetic force is applied to the beam. Advantageously, a vane is located on the beam such that when the beam is oscillated the vane generates air turbulence or currents to purge and displace toner particles and other contaminants from the vicinity of the sensor. The beam has a longitudinal arm member and, preferably, the vane is arranged on the arm member to extend in a lengthwise direction thereof to generate air currents when the arm member oscillates.

Advantageously, the vane is associated with a device that interrupts the electrostatic voltage to modulate the voltage with respect to the sensor, hereinafter simply "chopper". The chopper and vane are located at one end of the longitudinal arm member of the beam and, more preferably, the van/is integrated with the chopper in a generally L-shape configuration.

BRIEF DESCRIPTION OF THE DRAWINGS

Other objects and advantages of the present invention will become apparent from the following detailed description of preferred embodiments thereof taken in conjunction with the accompanying drawings, wherein.

DESCRIPTION OF ILLUSTRATIVE EMBODIMENTS

Figure 1:
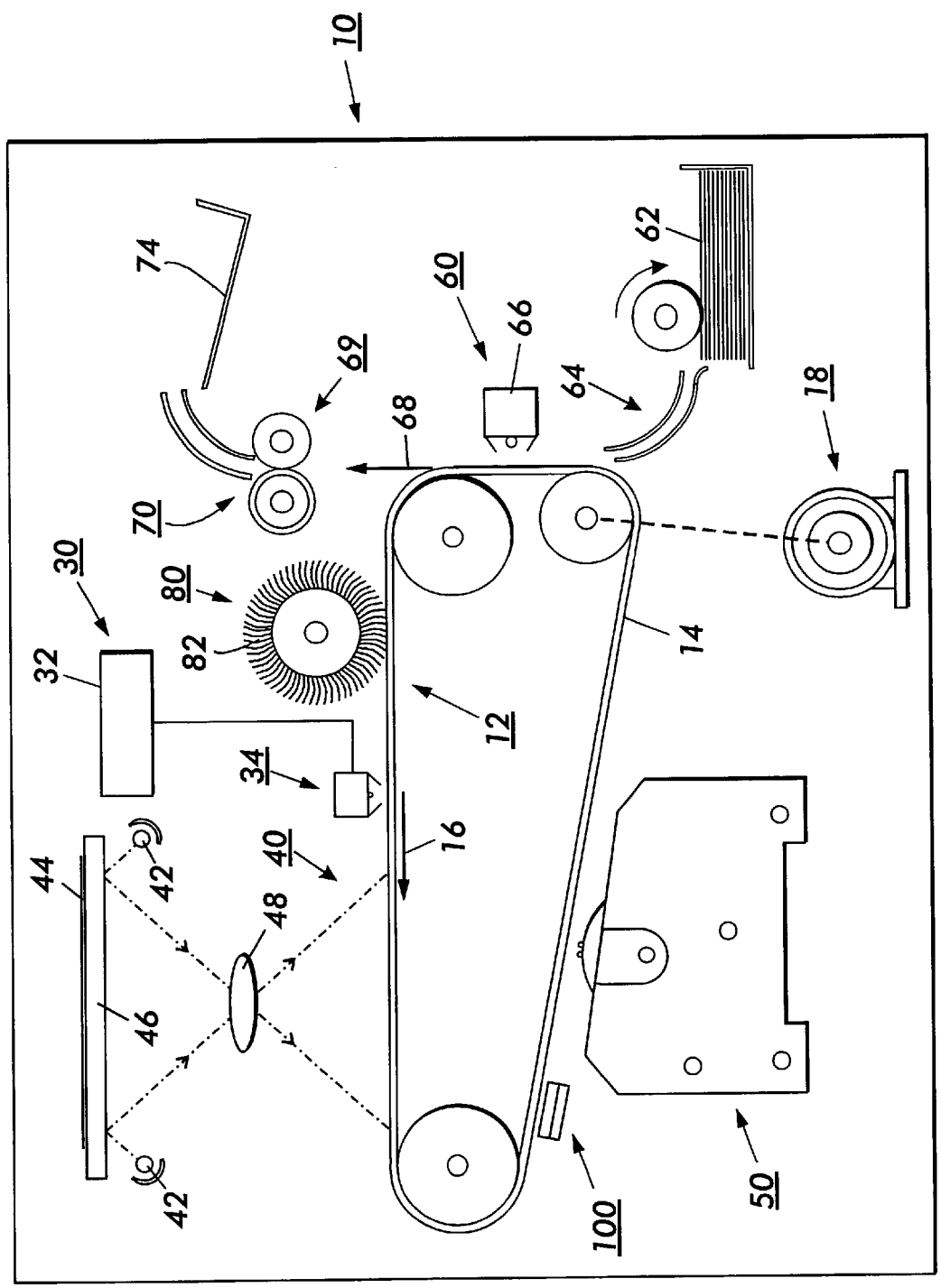
FIG. 1 is a schematic illustration of an exemplary electrophotographic apparatus with a photoreceptor belt and an electrostatic voltmeter in accordance with the present invention.

FIG. 1 discloses a simplified schematic of a one color electrophotographic system 10. In this, a photoreceptor 12 is shown as a continuous belt having a photoconductive exterior surface 14. Although the example in FIG. 1 shows a photoreceptor belt, other embodiments of the photoreceptor 12 may be used, such as a drum having an exterior photoconductive surface. The photoreceptor 12 is driven by a motor 18 in the direction indicated by arrow 16 so that the photoconductive surface 14 passes through various processing stations during a continuous loop imaging process.

A photoreceptor charging station 30 is shown in a position adjacent to the photoconductive surface 14 of the photoreceptor 12. A high voltage electrostatic charge is applied to the photoreceptor 12 by a power supply 32 and a corona generating device 34. An image formation or exposure station 40 is provided downstream of the corona device 34 and is operable to create a latent image on the photoreceptor surface 14. An original document 44 is placed on a transparent platen 46. One or more light sources 42 flash light onto the original document 44, which is reflected through a lens 48 onto the photoreceptor surface 14. Where light is intensely reflected from the original copy field areas onto the photoreceptor surface 14, the charge on the photoreceptor is dissipated leaving only a charge on the photoreceptor surface 14 corresponding to a latent image of the original document 44. Alternatively, a laser raster output scanner may be used or light emitting diode devices can be used to create an image from an electronic input stream.

An image development station 50 is provided downstream of the image formation station 40 for developing the latent image formed on the photoreceptor surface 14 by depositing charged toner particles on the latent image. An image transfer station 60 is provided for the toner latent image to be transferred from the photoreceptor surface 14 to a plain paper copy sheet 62, which is fed by a feeding apparatus 64. The transfer station 60 has a corona generating device 66 for spraying ions onto the back of a sheet of paper to attract the toner image thereto from the photoreceptor surface 14. An image fixing or fusing station 70 is provided and a sheet with a toner image fixed thereto is separated from the photoreceptor 12 and moved by rollers 69 in the direction of the arrow 68 to the fusing station 70 where a fuser assembly (not shown) heats, fuses and permanently affixes a toner image to a copy sheet forming a permanent copy of the original document 44. The completed copy is then deposited in a tray 74. A restoring or cleaning station 80 is provided for cleaning the surface of the photoreceptor 12, from which an image has been transferred to a copy sheet, with a brush 82 or the like, which removes residual toner particles, and a light (not shown) is emitted onto the photoreceptor 12 to dissipate any residual electrostatic charge.

During the foregoing photoelectrostatic imaging process, a small test image is laid down on the photoreceptor belt intermittent with full page photo latent images of original documents so that the electrostatic field on the photoreceptor belt may be monitored and modulated by an electrostatic voltmeter modulator assembly 100 positioned downstream of the image formation station 40 as shown in FIG. 1.

Figure 2:
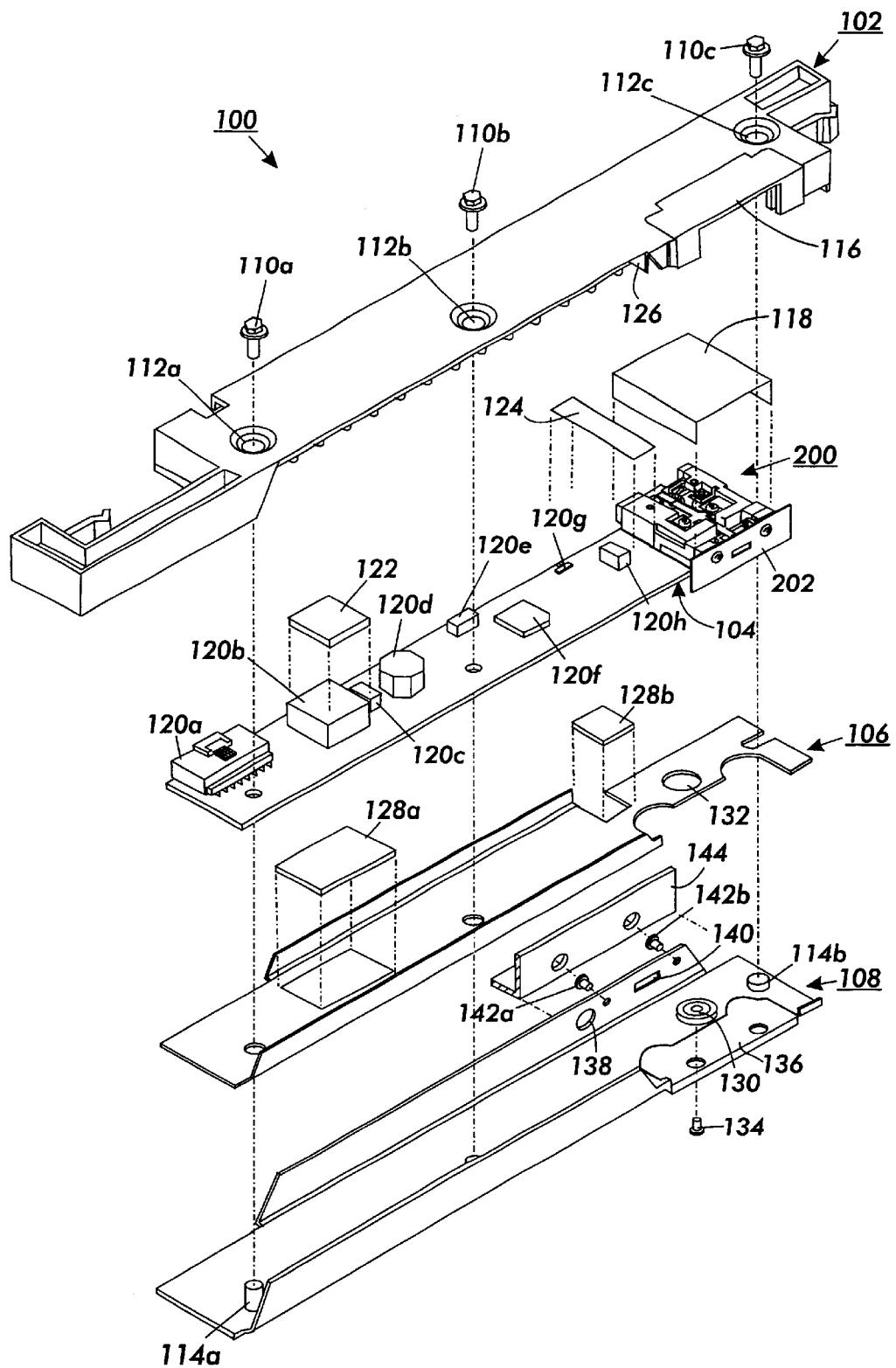
FIG. 2 is an exploded perspective view of an application specific integrated circuit electrostatic voltmeter assembly with a modulator assembly according to a preferred embodiment of the present invention.
Figure 3:
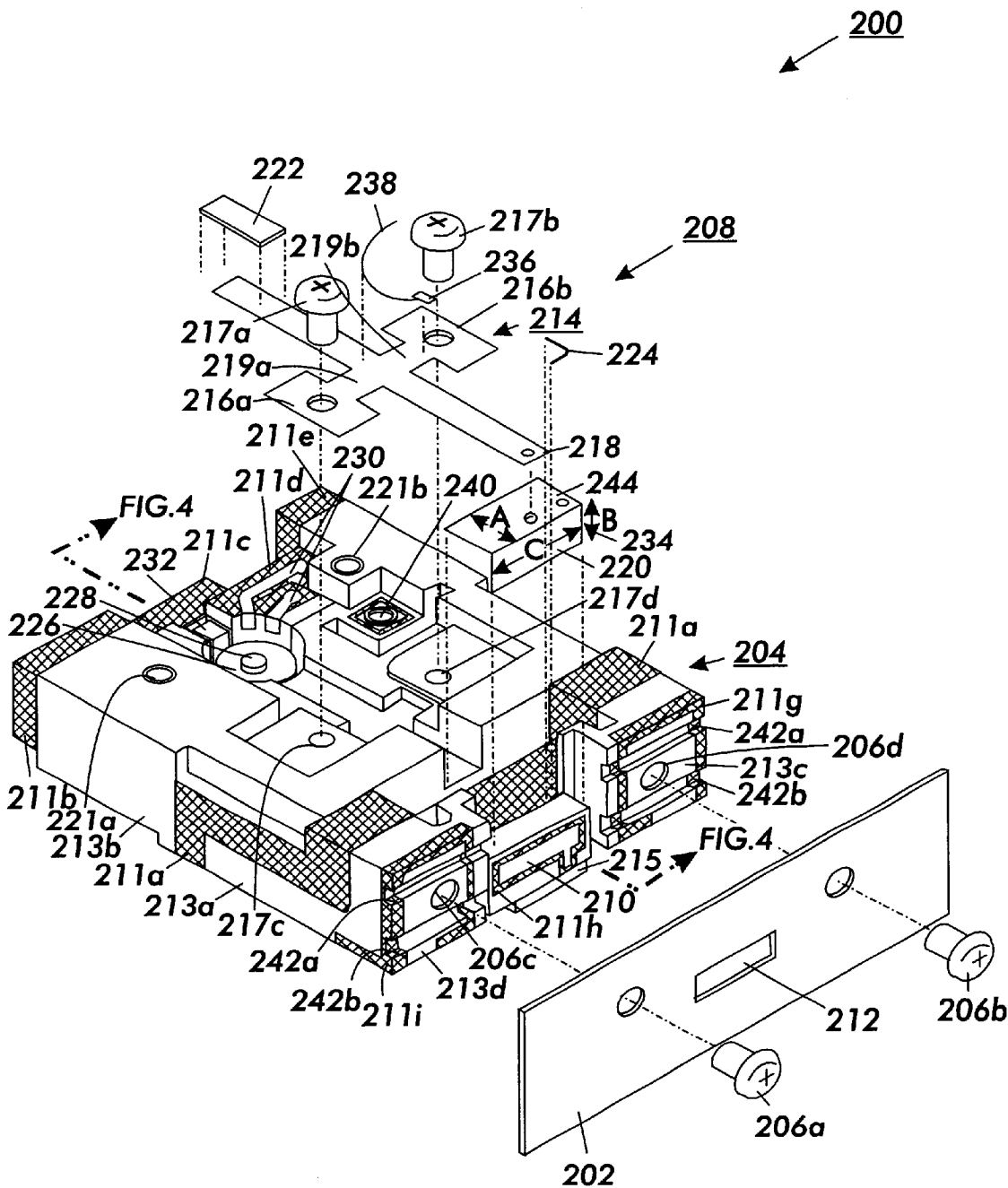
FIG. 3 is an enlarged perspective view of the modulator assembly in FIG. 2 with a single balanced beam vibratory element according to a preferred embodiment of the present invention.

FIGS. 2 and 3 show exploded views of an application specific integrated circuit electrostatic voltmeter assembly 100 and a modulator assembly 200 according to a preferred embodiment of the present invention. Referring to FIG. 2, the electrostatic voltmeter assembly 100 includes a cover 102, of a suitable material such as a plastic, a printed wire board assembly (hereinafter simply "board assembly") 104, and an insulating layer 106 for insulating the board assembly 104 from a base 108, of a suitable material such as steel. Fasteners 110($a$–$c$) at the cover 102 extend through holes 112($a$–$c$) to attach with receptacles 114($a$–$b$) at the base 108 for holding together the various sections of the electrostatic voltmeter assembly 100. The cover 102 has an anti-static member 116, which advantageously is located behind an aperture plate 202 of the modulator assembly 200 when the electrostatic voltmeter assembly 100 is assembled.

As shown in FIG. 2, the modulator assembly 200 is located on the board assembly 104. A paper board insulator 118 covers the top of the modulator assembly 200. Various electronic components 120($a$–$h$), shown schematically in FIG. 2, are located on the board assembly 104. One or more heat sinking members 122 are provided if it is necessary or desirable to remove heat from the electronic components 120. An air seal 124, preferably of anti-static plastic foam, is located on the board assembly 104 to seal a gap between the board assembly 104 and an air baffle 126 projecting downwardly from an inner surface of the cover 102 (described in more detail below with reference to FIG. 5).

Heat sinking gaskets 128($a$–$b$) are provided on the insulating layer 106 as necessary or desirable to remove heat from the board assembly 104. The base 108 has a cylindrical projection 130 for cooperation with a fastener 134, which extends through a hole 132 in the insulating layer 106, to support the modulator assembly 200. An anti-static member 136, corresponding to the anti-static member 116 on the cover 102, is provided on the base 108 so as to be located behind the front plate 202 of the modulator assembly 200. The anti-static members 116 and 136 are composed of a suitable anti-static plastic material.

An air purge exit 138 is provided through a vertical wall of the base 108 for permitting air used to purge the modulator assembly 200 to exit as described in further detail below. An alignment slot 140 is also provided in the vertical wall of the base 108 for positioning and alignment of the modulator assembly 200 such that the modulator assembly 200 is accurately oriented with respect to the photoreceptor surface 14. Fasteners 142(a–b) attach the rear of the modulator assembly 200 to the vertical portion of the base 108.

Figure 4:
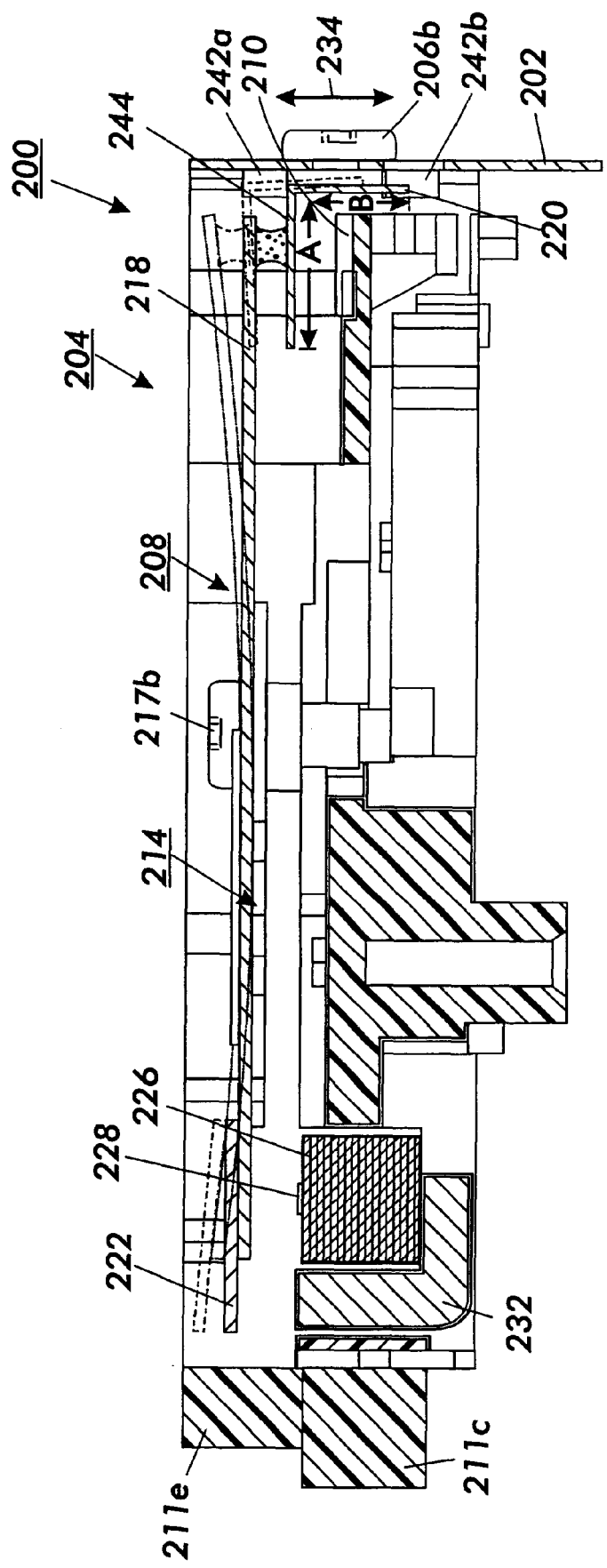
FIG. 4 is a full cross-sectional view of the modulator assembly of taken along section line 4—4 in FIG. 3.

Referring now to FIG. 3, the modulator assembly 200 has a front plate 202 which is attached to a modulator base 204 by fasteners 206(a–b). The assembly 200 includes a modulator 208 and a sensor electrode 210 (see also FIG. 4). The base 204 has insulating portions 211(a–i), schematically illustrated in FIGS. 3 and 4 by surface shading, and shielding areas 213(a–d). The sensor electrode 210 may be any commonly known sensor element suitable for capacitance coupling with an electrostatic field external to the base 204. In this, a sensing aperture 212 is provided in the front plate 202 of the base 204 for permitting the sensing capacitance coupling. The sensing aperture 212 is disposed at a position that is proximate to the position of the sensor electrode 210. The sensor electrode 210 produces a signal which corresponds to the magnitude of the external electrostatic field for transmission, via a conducting strip 215, to an external voltmeter (not shown).

The modulator 208 includes a vibratory beam 214 having mounting supports 216(a–b) at a midpoint of the beam 214 for securely mounting the beam 214 within the base 204 with fasteners 217(a–b). The vibrating beam 214 includes a longitudinal arm element 218 and connecting or web portions 219(a–b), which are between the arm element 218 and the mounting supports 216(a–b) and connect the mounting supports 216(a–b) to the arm element 218. The arm element 218 has a device for interrupting the electrostatic voltage or chopper 220 at one end of the arm element 218 and a counterweight strip or slug 222 made of a magnetically susceptible material, such as Fe, which will close the magnetic path (hereinafter simply "counterweight"), at the other end. A carbon fiber wire 224 is provided for electrically connecting the chopper 220 with the front shielding area 213a. A magnetic coil 226 with a permanent magnet 228 and coil connections 230 are located under the vibratory beam 214 at an end of the arm element 218 carrying the counterweight 222. The magnetic coil 226 operates as a magnetic driver to drive the vibratory beam 214 to oscillate by the magnetic force applied to the counterweight 222 via the magnetic path from the magnet 228 to the counterweight 222 and through a ferrite core 232 returning to the magnet 228. In this, vibratory motion is generated in the arm element 218 and the web portions 219(a–b) of the vibratory beam 214, with the vibratory motion of the web portions 219(a–b) increasing toward the center of the vibratory beam 214, whereas vibratory motion is not produced in the mounting supports 216(a–b) of the vibratory beam 214, which are firmly attached to the modulator base 204 by the fasteners 217(a–b). Advantageously, the counterweight 222 balances the chopper 220 at the other end of the arm element 218 and is located on the arm 218 so as to maximize the magnetic flux of the ferrite core 232. When the arm element 218 is induced to vibrate by the magnetic coil 226, the chopper 220 oscillates in the directions indicated by arrows 234 in FIG. 3 and 4. During the oscillation, the sensor electrode 210 repeatedly couples and decouples to an external electrostatic field as the chopper 220 passes the sensing aperture 212 in the front plate 202. Specifically, when the arm element 218 is vibrated or oscillated by influence of the magnetic flux of the ferrite core 232, the oscillation that results causes the chopper 220 to vibrate up and down across the sensing aperture 212 causing the sensor electrode 210 to couple and decouple with an external electrostatic field on a photoreceptor belt 14 through the sensing aperture 212.

Accordingly, oscillation of the arm element 218 results from the force applied by the magnetic coil 226, which functions as a magnetic driver for the vibratory element 208. A feedback crystal or piezoelectric pickup 236, advantageously located at one of the web portions 219(a–b) of the beam 214, senses the vibrations and generates feedback signals to a feedback control circuit (not shown). In this, the drive signals supplied to the magnetic coil 226 are regulated and the frequency and mode of the vibrations of the arm element 218 can be controlled. The feedback signals of the feedback crystal 236 are outputted via a Litz wire connection 238 soldered at 240.

As previously described, the chopper 220 vibrates up and down across the sensing aperture 212. Air purge grooves 242(a–b) are provided across the front of the base 204 to enable air flow to be delivered across the sensor electrode 210. This air flow is operably provided around the sensing aperture 212 and the sensor electrode 210 for purging toner particles and other contaminants from the modulator 208 and sensor electrode 210. In accordance with the subject invention, a vane or plate element 244 is connected to the arm element 218 adjacent to the chopper 220 to enhance the purging effect of the air flow through the grooves 242(a–b). In a preferred embodiment, the vane 244 is formed by extending the chopper 220 backward so as to form an integral vane 244, which is generally horizontal relative to the vertically disposed chopper 220 forming an "L" shaped configuration with the chopper 220. The rapid vibration of the arm element 218 and the vane 244 stirs up the air passing through channels 242a and 242b and past the chopper 220 such that the modulator 208 and sensor electrode 210 are self-purged of debris by reciprocal movement of the vane 244 when the arm element 218 oscillates.

Figure 5:
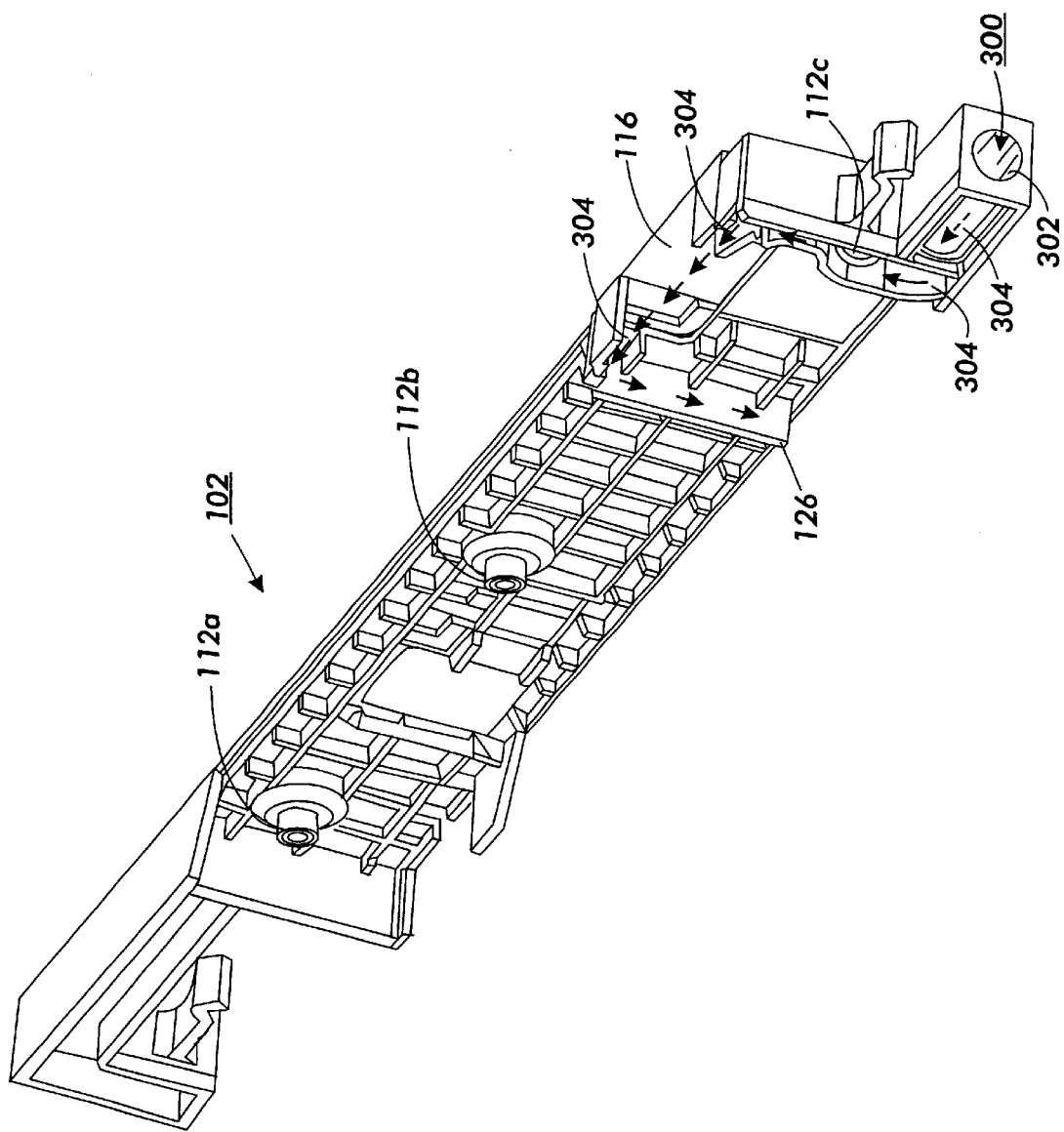
FIG. 5 is a perspective view of the inner surface of a cover of the electrostatic voltmeter assembly of FIG. 2 showing an air purge path.

FIG. 5 shows the inner surface of the cover 102 showing the air purge path by arrows 300. An air inlet 302 is provided for air to be delivered to channels 304 in the cover 102. The channels 304 direct air along an air path so as to pass via the air purge grooves 242a and 242b of the modulator base 204 across the sensing aperture 212 and in front of the sensor electrode 210. Air flows from the air purge exit 138 in the electrostatic voltmeter assembly base 108 (shown in FIG. 2). The baffle 126 is provided to guide the air to the air purge exit 138.

It has been determined that as the vane 244 oscillate up and down at high frequency, the motion of the vane 244 produces an advantageous turbulence or air current in the vicinity of the modulator 208 and the sensor electrode 210 which enhances the purging of toner particles and other contaminants from the modulator assembly 200. The turbulence generated by the vane 244 serves as a fan or pump and is beneficial in at least two major respects.

First, the turbulence and air currents generated by the "fanning" motion of the vane 244 prevent toner particles and other contaminants from settling or collecting in the modulator assembly 200, in particular, in the vicinity of the modulator 208 and the sensor electrode 210. Accordingly, contaminants inside the electrostatic voltmeter probe are kept airborne so that they may be more easily flushed out by air purging. In this, by providing the vane 244 attached to the vibrating modulator arm element 218 it has been found that the vane 244 sets up an airflow to keep the modulator assembly 200 clean.

Second, the self-enhanced turbulence generated by oscillation of the vane 244 enhances and improves the purging effect of the passing air from the purging grooves 242(a–b) thereby eliminating or minimizing drift errors of the type discussed above. By extending the chopper 220 that is attached to the vibrating arm element 218 to form the vane 244 removal of toner and other contaminants from the electrostatic voltmeter is improved.

Although, the location of the vane 244 on the arm element 218 may be at any location, which provides the above advantageous air turbulence or currents, it has been found that by locating the vane 244 at a terminal end of the arm element 218 such that it abuts the chopper 220, or, in a preferred embodiment, is integrated with the chopper 220, provides further advantageous results. In this, a location of the vane 244 at the end of the arm element 218 provides a further beneficial electrostatic shielding effect for the sensor electrode 210. More specifically, positioning the vane 244 directly above the sensor electrode 210 shields the sensor electrode 210 from signals generated by the motion of the arm element 218, which would otherwise tend to cause error in the sensing by the sensor electrode 210. Furthermore, by integrating the vane 244 and the chopper 220 as a single element, fabrication and assembly are simplified. In this, the vane 244 and chopper 220 may easily be formed by bending a single piece of suitable material such as, for example, 0.010" brass shim stock. Furthermore, the dimensions of the vane 244 are determined so as to maximize the advantageous fanning and shielding effects. In other words, the vane 244 is made to maximize the fanning effect without inhibiting or preventing oscillation of the beam arm element 218. The dimensions of the modulator base 204 and the size of the sensor 210 influence or control the dimensions of the vane 244. In other words, the size of the modulator base 204 and the dimensions of the slot therein for the vane 244 and the size of the sensor electrode 210, which is to be shielded by the vane 244, influence the dimensions of the vane 244. Accordingly, it will be appreciated that by varying the dimensions of the modulator base 204 and the size of the sensor electrode 210 the dimensions of the vane 244 may be changed. In a preferred embodiment, in cross-section, the length A of the vane 244 in the longitudinal direction of the arm element 218 is greater than the height B of the chopper 220. More preferably, the length A of the vane 244 is about 3.5 mm, the height B of the chopper 220 is about 3 mm, and the width C of the vane 244 (as shown in FIG. 2) is about 7.5 mm. As discussed above, it is envisioned that under other circumstances the aforementioned dimensions of the vane 244 may be varied so as to meet the specific requirements of a modulator base and/or sensor element.

After reading and understanding the foregoing description of preferred embodiments of the invention, in conjunction with the illustrative drawings, it will be appreciated that several distinct advantages of the subject system for purging a modulator assembly of an electrostatic voltmeter are obtained.

A preferred embodiment of the invention has a self-enhanced purging system for minimizing or eliminating drift errors in electrophotographic devices by providing a vane that is located at the vibratory beam of the modulator assembly for generating air turbulence and currents in the vicinity of the modulator and sensor electrode when the beam oscillates. More preferably, the vane is integrated with the chopper of the vibratory beam thereby eliminating need for a separate element while providing beneficial results. The subject vane generates air turbulence during motion of the beam on which it is located such that toner particles and other contaminants are more effectively purged from the modulator assembly and such contaminants, which cause drift errors, are prevented from settling on or around the modulator and/or sensor electrode. Advantageously, the vane also provides a beneficial shielding of the sensor electrode.

In describing the invention, reference has been made to preferred embodiments and illustrative advantages of the invention. Those skilled in the art, however, and familiar with the instant disclosure of the subject invention, may recognize additions, deletions, modifications, substitutions and other changes that fall within the purview of the subject invention.

What is claimed is:

1. A modulator assembly for an electrostatic voltmeter, comprising:

a modulator base;

a vibratory beam disposed in said base for oscillating when a vibratory magnetic force is applied at one end of said beam; and a vane located at the other end of said beam, said vane shaped to enhance air resistance in its direction of motion, whereby when said beam oscillates corresponding movement of said vane generates airflow for purging and displacing toner particles and contaminants from the vicinity of said vane.

2. A modulator assembly for an electrostatic voltmeter as defined in claim 1, wherein:

said beam has a longitudinal arm element extending within said base;

said vane being arranged on said beam to extend in a lengthwise direction along said longitudinal arm element.

3. A modulator assembly for an electrostatic voltmeter as defined in claim 2, further comprising:

a chopper at one end of said longitudinal arm element of said beam; and said vane is connected to said chopper.

4. A modulator assembly for an electrostatic voltmeter as defined in claim 3, wherein:

said vane is integrated with said chopper in a generally L-shaped cross-sectional arrangement.

5. A modulator assembly for an electrostatic voltmeter as defined in claim 3, wherein:

said chopper is bent to extend along said lengthwise direction of said arm element thereby forming said vane.

6. A modulator assembly for an electrostatic voltmeter as defined in claim 1, further comprising:

a sensor electrode disposed in said base for sensing electrostatic voltage outside said base;

said vane being located on said beam such that said vane shields said sensor electrode from signals generated by oscillation of said beam and generates airflow for purging and displacing toner particles and contaminants from a vicinity of said sensor electrode.

7. A modulator assembly for an electrostatic voltmeter as defined in claim 1, further comprising:

at least one air purge groove at a front end of said modulator base, said vane generating airflow with respect to air passing through said at least one air purge groove.

8. A modulator assembly for an electrostatic voltmeter as defined in claim 7, wherein:

said at least one air purge groove comprises a pair of parallel grooves.

* * * * *